United States Patent
Ikeda

(10) Patent No.: US 11,581,890 B2
(45) Date of Patent: Feb. 14, 2023

(54) SWITCHING APPARATUS AND SWITCHING METHOD

(71) Applicant: FUJI ELECTRIC CO., LTD., Kawasaki (JP)

(72) Inventor: Harunobu Ikeda, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/456,579

(22) Filed: Nov. 25, 2021

(65) Prior Publication Data

US 2022/0224327 A1    Jul. 14, 2022

(30) Foreign Application Priority Data

Jan. 14, 2021    (JP) .............................. JP2021-004291

(51) Int. Cl.
*H03K 3/012* (2006.01)
*H03K 17/00* (2006.01)
*H03K 17/567* (2006.01)
*H03K 17/693* (2006.01)
*H03K 17/687* (2006.01)

(52) U.S. Cl.
CPC ......... *H03K 17/567* (2013.01); *H03K 17/687* (2013.01)

(58) Field of Classification Search
None
See application file for complete search history.

(56) References Cited

U.S. PATENT DOCUMENTS

| | | | |
|---|---|---|---|
| 9,106,156 B2* | 8/2015 | Tanaka ................ | H02M 7/003 |
| 9,722,581 B2* | 8/2017 | Zhao ................... | H03K 17/284 |
| 2014/0184303 A1 | 7/2014 | Hasegawa | |
| 2018/0287510 A1 | 10/2018 | Saha | |
| 2020/0412359 A1* | 12/2020 | Van Brunt ............ | H03K 17/76 |

FOREIGN PATENT DOCUMENTS

| | | | | |
|---|---|---|---|---|
| JP | H03129474 A | 6/1991 | | |
| JP | 04-354156 | * 12/1992 | ............ | H01L 25/04 |
| JP | H04354156 A | 12/1992 | | |
| JP | 2014130909 A | 7/2014 | | |
| JP | 2018029259 A | 2/2018 | | |
| WO | 2017086201 A1 | 5/2017 | | |

* cited by examiner

*Primary Examiner* — Kenneth B Wells

(57) ABSTRACT

Provided is a switching apparatus, including: a first semiconductor switching device of IGBT, and a second semiconductor switching device of a different type from IGBT, which are electrically connected in parallel; and a control unit configured to turn on the second semiconductor switching device before the first semiconductor switching device, wherein a maximum rated current of the second semiconductor switching device is greater than a maximum rated current of the first semiconductor switching device.

15 Claims, 4 Drawing Sheets

SWITCHING APPARATUS AND SWITCHING METHOD

The contents of the following Japanese patent application(s) are incorporated herein by reference:
2021-004291 filed in JP on Jan. 14, 2021.

BACKGROUND

1. Technical Field

The present invention relates to a switching apparatus and a switching method.

2. Related Art

Conventionally, various methods have been proposed to reduce switching loss (refer to, for example, Patent Document 1).

Patent Document 1: Japanese Patent Application Publication No. H04-354156

Patent Document 2: Japanese Patent Application Publication No. 2014-130909

In recent years, there has been a growing demand for further reduction of turn-on loss.

SUMMARY

In order to solve the aforementioned problem, a first aspect of the present invention provides a switching apparatus. The switching apparatus may include a first semiconductor switching device of IGBT, and a second semiconductor switching device of a different type from IGBT, which are electrically connected in parallel. The switching apparatus may include a control unit configured to turn on the second semiconductor switching device before the first semiconductor switching device. A maximum rated current of the second semiconductor switching device may be greater than a maximum rated current of the first semiconductor switching device.

The control unit may be configured to make a time difference between the first semiconductor switching device being switched and the second semiconductor switching device being switched smaller in a case of turn-on than in a case of turn-off.

A second aspect of the present invention provides a switching apparatus. The switching apparatus may include a first semiconductor switching device of IGBT and a second semiconductor switching device of a different type from IGBT, which are electrically connected in parallel. The switching apparatus may include a control unit configured to control the first semiconductor switching device and the second semiconductor switching device. The control unit may be configured to make a time difference between the first semiconductor switching device being switched and the second semiconductor switching device being switched smaller in a case of turn-on than in a case of turn-off.

The control unit may be configured to set the time difference to zero or a negative value during turn-on.

The control unit may be configured to set the time difference to a positive value during turn-off.

The second semiconductor switching device may be a MOSFET.

The second semiconductor switching device may be a wide bandgap semiconductor device.

A third aspect of the present invention provides a switching method. The switching method may include controlling to turn on a second semiconductor switching device before a first semiconductor switching device among the first semiconductor switching device of IGBT and the second semiconductor switching device of a different type from IGBT, which are connected electrically in parallel. The maximum rated current of the second semiconductor switching device may be greater than the maximum rated current of the first semiconductor switching device.

A fourth aspect of the present invention provides a switching method. The switching method may include controlling a first semiconductor switching device of IGBT and a second semiconductor switching device of a different type from IGBT, which are connected electrically in parallel. In the controlling, a time difference between the first semiconductor switching device being switched and the second semiconductor switching device being switched may be smaller in a case of turn-on than in a case of turn-off.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention. However, the following embodiments do not limit the claimed invention. In addition, not all combinations of features described in the embodiments are essential to the solution of the invention.

Figure 1:
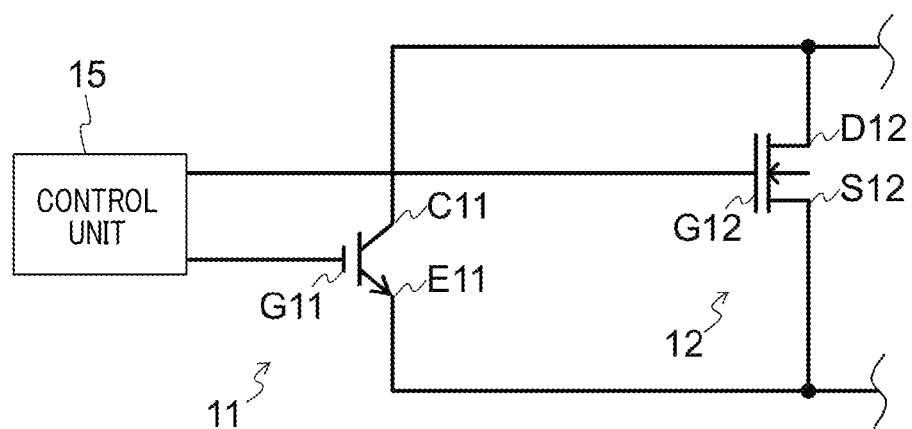
FIG. 1 illustrates a switching apparatus 1 according to the present embodiment.

FIG. 1 illustrates a switching apparatus 1 according to the present embodiment. The switching apparatus 1 includes a first semiconductor switching device 11 and a second semiconductor switching device 12, which are electrically connected in parallel, and a control unit 15. Note that the switching apparatus 1 may include any apparatus for performing the switching internally, such as a half-bridge circuit or a chopper circuit.

The first semiconductor switching device 11 is an IGBT (Insulated Gate Bipolar Transistor), which is also referred to as an IGBT 11. The IGBT 11 may have a gate terminal G11, a collector terminal C11, and an emitter terminal E11.

The IGBT 11 may have a lower saturation voltage than the second semiconductor switching device 12 in the steady ON state, and may have a larger current than the second semiconductor switching device 12 flowing therethrough. Note that the IGBT 11 has a slower switching speed than the second semiconductor switching device 12, so the turn-on loss can be larger, and the turn-off loss can be larger due to the tail current.

The IGBT 11 may be a semiconductor device made of a semiconductor material with a small bandgap. The semiconductor material with a small bandgap may be silicon or gallium arsenide or the like, as an example. These semiconductor materials are less expensive than those with a larger bandgap, which makes the switching apparatus 1 cheaper.

The second semiconductor switching device 12 is a different type of semiconductor switching device from the IGBT. The second semiconductor switching device 12 may be a device that has a faster switching speed than the IGBT 11 and does not generate a tail current during turn-off. In the present embodiment, as an example, the second semiconductor switching device 12 is a MOSFET (Metal-Oxide-Semiconductor Field-Effect Transistor), which is also referred to as a MOSFET 12. The MOSFET 12 may have a gate terminal G12, a drain terminal D12, and a source terminal S12.

The maximum rated current of the MOSFET 12 may be larger than the maximum rated current of the IGBT 11. As one example, the maximum rated current of the IGBT 11 and the maximum rated current of the MOSFET 12 may be IGBT: MOS=4:6. Note that the maximum rated current may be a maximum value of the current that can flow in the device, or may be larger depending on the size of the device (area as one example).

The MOSFET 12 may be a wide bandgap semiconductor device formed of a semiconductor material with a large bandgap. The semiconductor material with a large bandgap may be, as one example, SiC, GaN, diamond, gallium nitride materials, gallium oxide materials, AlN, AlGaN, ZnO and so on.

Herein, the IGBT 11 and the MOSFET 12 may be electrically connected in parallel, which means that the collector terminal C11 of the IGBT 11 is electrically connected to the drain terminal D12 of the MOSFET 12, and the emitter terminal E11 of the IGBT 11 is electrically connected to the source terminal S12 of the MOSFET 12. The IGBT 11 and the MOSFET 12 may be electrically connected in parallel between two external terminals (also referred to as an external emitter terminal and an external collector terminal) of the switching apparatus 1. In the present embodiment, as an example, the emitter terminal E11 of IGBT 11 and the source terminal S12 of MOSFET 12 may be connected to the external emitter terminal, and the collector terminal C11 of IGBT 11 and the drain terminal D12 of MOSFET 12 may be connected to the external collector terminal.

Note that the gate terminal G11 of the IGBT 11 and the gate terminal G12 of the MOSFET 12 may have a control unit 15 connected thereto. Also, a freewheeling diode (not illustrated) may be connected in reverse parallel to the IGBT 11 and the MOSFET 12, respectively. This freewheeling diode may function as a freewheeling diode for the current returning from the emitter side. In addition to this, or instead of this, a body diode (also referred to as a parasitic diode) may be connected in reverse parallel to the MOSFET 12.

The control unit 15 controls the IGBT 11 and the MOSFET 12. The control unit 15 may make the time difference between the IGBT 11 being switched and the MOSFET 12 being switched smaller in the case of turn-on than in the case of turn-off.

For example, if the time difference between the IGBT 11 being switched and the MOSFET 12 being switched when switching the switching apparatus 1 is "$\Delta T$", the control unit 15 may control the IGBT 11 and the MOSFET 12 so that the following Expression (1) is satisfied.

$$\Delta T_{-ON} < \Delta T_{-OFF} \quad (1)$$

In the expression, the subscripts "$_{ON}$" and "$_{OFF}$" for the time difference $\Delta T$ indicate that the time difference is for turn-on and turn-off, respectively. The case of turn-on may be the case of turning on the switching apparatus 1, or may be the case of conducting between the external emitter terminal and the external collector terminal. The case of turn-off may be the case of turning off the switching apparatus 1, or may be the case of disconnecting between the external emitter terminal and the external collector terminal.

The switching timing may be the timing when the gate voltage exceeds/falls below the threshold voltage of the device. Also, the time difference $\Delta T$ may be a positive value if the switching timing of the IGBT 11 is before the switching timing of the MOSFET 12, or may be a negative value if the switching timing of the IGBT 11 is after the switching timing of the MOSFET 12. For example, the time difference $\Delta T$ may be the value expressed by $\Delta T=T2-T1$ when the switching timing of the IGBT 11 is "T1" and the switching timing of the MOSFET 12 is "T2", and may be as large as 1 μsec to 10 μsec or 100 μsec. As an example, the time difference $\Delta T$ may be 5 μsec if the MOSFET 12 is switched 5 μsec after the IGBT 11 is switched.

The control unit 15 may set the time difference $\Delta T$ to a positive value in the case of turn-off or zero or a negative value in the case of turn-on. In other words, the control unit 15 may set the switching timing of the IGBT 11 before the switching timing of the MOSFET 12 in the case of turn-off, or may set the switching timing of the IGBT 11 at the same time as or later than the switching timing of the MOSFET 12 in the case of turn-on.

For example, the control unit 15 may control the IGBT 11 and the MOSFET 12 so that the following Expression (2) is further satisfied.

$$\Delta T_{-ON} \leq 0 < \Delta T_{-OFF} \quad (2)$$

Note that the control unit 15 may control the IGBT 11 and the MOSFET 12 by driving the gates of the IGBT 11 and the MOSFET 12, respectively. The control unit 15 may control the switching timing of the IGBT 11 and the MOSFET 12 based on the turn-on signal and turn-off signal included in the control signals supplied from an external signal source (not illustrated). The control signal is a common signal for the IGBT 11 and the MOSFET 12, as an example in the present embodiment, but it may be a unique signal for each of the IGBT 11 and the MOSFET 12.

The control unit 15 may digitally control the switching timing of the IGBT 11 and the MOSFET 12. For example, the control unit 15 may be an IC (Integrated Circuit), and in the present embodiment, it may be a microcomputer as an example. In addition to this, the control unit 15 may control the switching timing of the IGBT 11 and the MOSFET 12 by supplying gate drive signals to the IGBT 11 and the MOSFET 12 through different gate resistances. The gate resistance may be the same or different for the turn-on and turn-off cases.

According to the switching apparatus 1 described above, the IGBT 11 and the MOSFET 12 are electrically connected in parallel, and the time difference $\Delta T$ between the IGBT 11 being switched and the MOSFET 12 being switched is smaller in the case of turn-on than in the case of turn-off. Therefore, the turn-on loss can be reduced because it is possible to reduce the current crowding during the turn-on period on the IGBT 11, which has a large turn-on loss.

Also, in the case of turn-on, the time difference $\Delta T$ is set to zero or a negative value, so that the MOSFET 12 is turned on at the same time as the IGBT 11 or before the IGBT 11. Therefore, compared to the case where the IGBT 11 is turned on before the MOSFET 12, it is possible to prevent current crowding in the IGBT 11, which has a large turn-on loss, during the turn-on period, thus further reducing the turn-on loss.

Also, in the case of turn-off, the time difference ΔT is set to a positive value, so the second semiconductor switching device 12 (the MOSFET 12 as an example in the present embodiment) is turned off after the IGBT 11 is turned off. Therefore, since the switching apparatus 1 is turned off when the second semiconductor switching device 12 is turned off, the turn-off characteristics of the MOSFET 12 are reflected in the transient characteristics during turn-off, or in other words, the turn-off characteristics of the IGBT 11, which has a large turn-off loss due to tail current, are not expressed. Therefore, the switching loss can be reduced.

In addition, since the second semiconductor switching device 12 is a MOSFET that, different from the IGBT 11, does not generate a tail current during turn-off, switching losses due to the tail current during turn-off of the IGBT can be reliably reduced by making the turn-off later than the IGBT 11.

In addition, since the MOSFET 12 is a wide bandgap semiconductor device, switching by the MOSFET 12 can be made faster. Therefore, by turning on the MOSFET 12 before the IGBT 11, the turn-on loss can be reduced. Also, by turning off the MOSFET 12 after the IGBT 11, the turn-off loss can be reduced.

Figure 2:
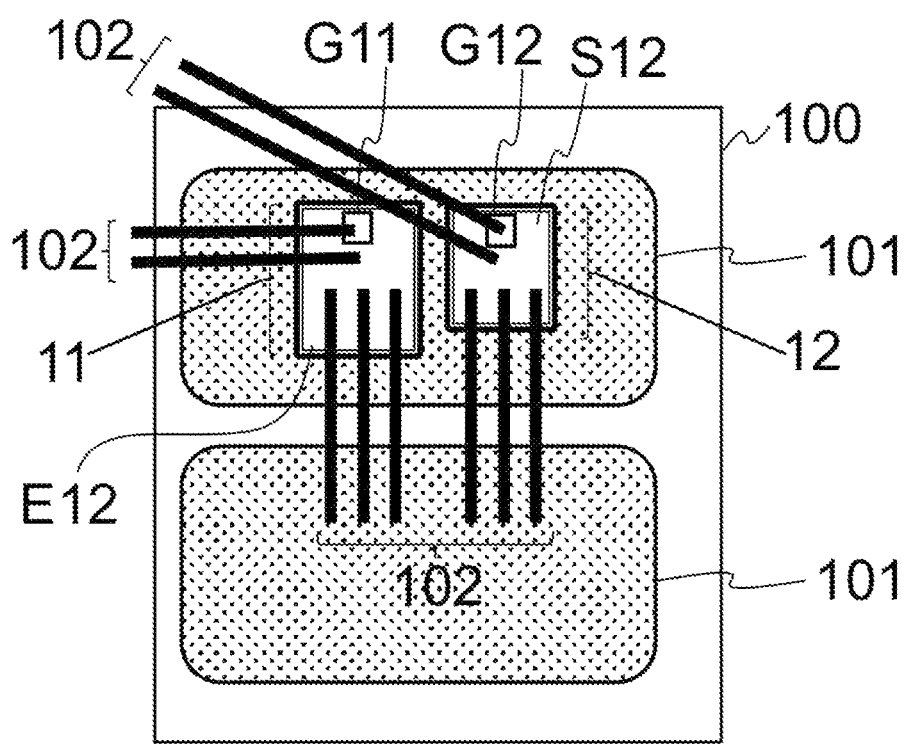
FIG. 2 illustrates an arrangement of an IGBT 11 and a MOSFET 12.

FIG. 2 illustrates an arrangement of the IGBT 11 and the MOSFET 12. The IGBT 11 and the MOSFET 12 may each be formed as chips in a vertical structure and arranged on a conductive layer 101 provided on the surface of the substrate 100.

For example, the IGBT 11 may have a collector terminal C11 on the lower surface, not illustrated, and a gate terminal G11 and an emitter terminal E11 on the upper surface. The collector terminal C11 may be connected to the conductive layer 101 or may be connected to the external collector terminal of the switching apparatus 1 through the conductive layer 101. The gate terminal G11 may be connected to the control unit 15 via the bonding wire 102, or the emitter terminal E11 may be connected to the external emitter terminal of the switching apparatus 1 via the bonding wire 102.

Also, the MOSFET 12 may have a drain terminal D12 on the lower surface, not illustrated, and the gate terminal G12 and the source terminal S12 on the upper surface. The drain terminal C12 may be connected to the conductive layer 101 or may be connected to the external collector terminal of the switching apparatus 1 through the conductive layer 101. The gate terminal G12 may be connected to the control unit 15 via the bonding wire 102, or the source terminal S12 may be connected to the external emitter terminal of the switching apparatus 1 via the bonding wire 102.

Note that these substrates 100, the IGBT 11, and the MOSFET 12 may be arranged in a housing, not illustrated, and resin-sealed.

Figure 3:
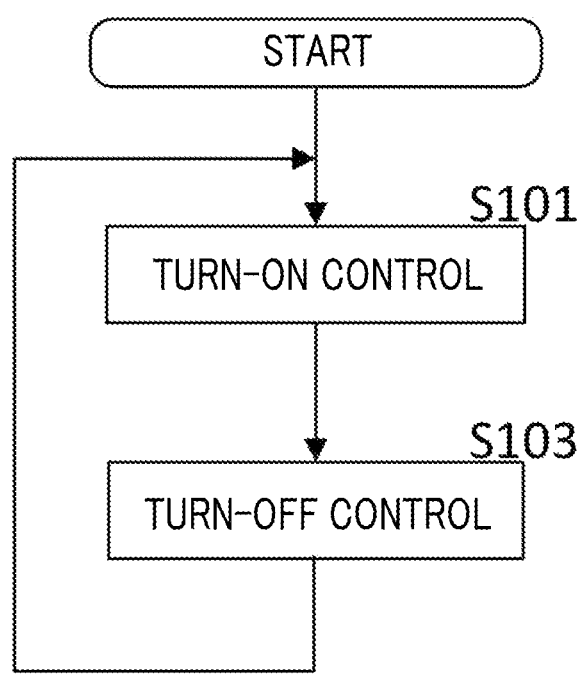
FIG. 3 illustrates operations of the switching apparatus 1.

FIG. 3 illustrates operations of the switching apparatus 1. The switching apparatus 1 performs switching by the processing steps S101 to S103.

In step S101, the control unit 15 turns on the IGBT 11 and the MOSFET 12. The control unit 15 may turn on the IGBT 11 and the MOSFET 12 with a preset time difference $\Delta T_{-ON}$. More specifically, the control unit 15 may turn on the IGBT 11 and the MOSFET 12 so that the gate voltage of the IGBT 11 exceeds the threshold voltage of the IGBT 11 and the gate voltage of the MOSFET 12 exceeds the threshold voltage of the MOSFET 12 with a time difference $\Delta T_{-ON}$. As a result, the gate voltage of the MOSFET 12 reaches the threshold voltage and current flows in the MOSFET 12. At the same time or after this, the gate voltage of the IGBT 11 reaches the threshold voltage and current also flows in the IGBT 11.

Herein, the time difference $\Delta T_{-ON}$ may be set arbitrarily by trial and error during the development of each device so that the turn-on loss due to the current crowding in the IGBT 11 during the turn-on period is reduced, or may be set based on the device characteristics described in the data sheet (also referred to as spec sheet) of the device (as an example, turn-on delay time).

In step S103, the control unit 15 turns off the IGBT 11 and the MOSFET 12. The control unit 15 may turn off the IGBT 11 and the MOSFET 12 with a preset time difference $\Delta T_{-OFF}$. More specifically, the control unit 15 may turn off the IGBT 11 and the MOSFET 12 so that the gate voltage of the IGBT 11 is below the threshold voltage of the IGBT 11 and the gate voltage of the MOSFET 12 is below the threshold voltage of the MOSFET 12 with a time difference $\Delta T_{-OFF}$.

As an example in the present embodiment, the time difference $\Delta T_{-OFF}$ may be a positive value. As a result, at the stage when the gate voltage of the IGBT 11 falls below the threshold voltage and the current flowing through the IGBT 11 drops and a tail current is generated, the current flows on the side of the MOSFET 12, so that the switching apparatus 1 as a whole is held in a steady ON state and no turn-off loss is generated. Then, the gate voltage of the MOSFET 12 falls below the threshold voltage, and the current flowing through the MOSFET 12, and thus current through the switching apparatus 1, decreases, causing the switching apparatus 1 to turn off.

Herein, the time difference $\Delta T_{-OFF}$ in the case of turn-off may be larger than the time difference $\Delta T_{-ON}$ in the case of turn-on. The time difference $\Delta T_{-OFF}$ may be set arbitrarily by trial and error during the development of each device so that the turn-on loss due to the tail current of the IGBT 11 is reduced, or it may be set based on the device characteristics (turn-off delay time as an example) described in the data sheet of the device.

Note that in the above embodiment, the control unit 15 is described as making the time difference ΔT smaller in the case of turn-on than in the case of turn-off, but in addition to or instead of this, as long as the maximum rated current of the MOSFET 12 is greater than the maximum rated current of the IGBT 11, the MOSFET 12 may be turned on before the IGBT 11. In this case, since the MOSFET 12 is turned on before the IGBT 11, the turn-on loss can be reduced by preventing the current crowding during the turn-on period in the IGBT 11, which has a large turn-on loss. In addition, since the maximum rated current of the MOSFET 12 is larger than that of the IGBT 11, even when the MOSFET 12 is turned on first and a large current flows into the MOSFET 12, the current flowing into the MOSFET 12 can reach the saturation current, prevent the turn-on speed from decreasing and reduce the switching loss.

Also, the second semiconductor switching device 12 is described as a MOSFET, but different from an IGBT, the second semiconductor switching device 12 may be any other type of semiconductor switching device as long as it does not generate a tail current during turn-off.

Also, various embodiments of the present invention may be described with reference to flowcharts and block diagrams. Blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, logical OR, logical XOR, logical NAND, logical NOR, and other logical operations, flip-flops, registers, memory elements, etc., such as field-programmable gate arrays (FPGA), programmable logic arrays (PLA), and the like.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of the computer-readable medium may include an electronic storage medium, a magnetic storage medium, an optical storage medium, an electromagnetic storage medium, a semiconductor storage medium, and the like. More specific examples of the computer-readable medium may include a Floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY (registered trademark) disc, a memory stick, an integrated circuit card, and the like.

The computer-readable instruction may include an assembler instruction, an instruction-set-architecture (ISA) instruction, a machine instruction, a machine dependent instruction, a microcode, a firmware instruction, state-setting data, or either a source code or an object code written in any combination of one or more programming languages, including an object-oriented programming language such as Smalltalk (registered trademark), JAVA (registered trademark), C++, or the like, and a conventional procedural programming language such as a "C" programming language or a similar programming language.

Computer-readable instructions may be provided to a processor of a general purpose computer, special purpose computer, or other programmable data processing apparatus, or to a programmable circuitry, locally or via a local area network (LAN), wide area network (WAN) such as the Internet, or the like, to execute the computer-readable instructions to create means for performing operations specified in the flowcharts or block diagrams. Examples of the processor include a computer processor, a processing unit, a microprocessor, a digital signal processor, a controller, a microcontroller, and the like.

Figure 4:
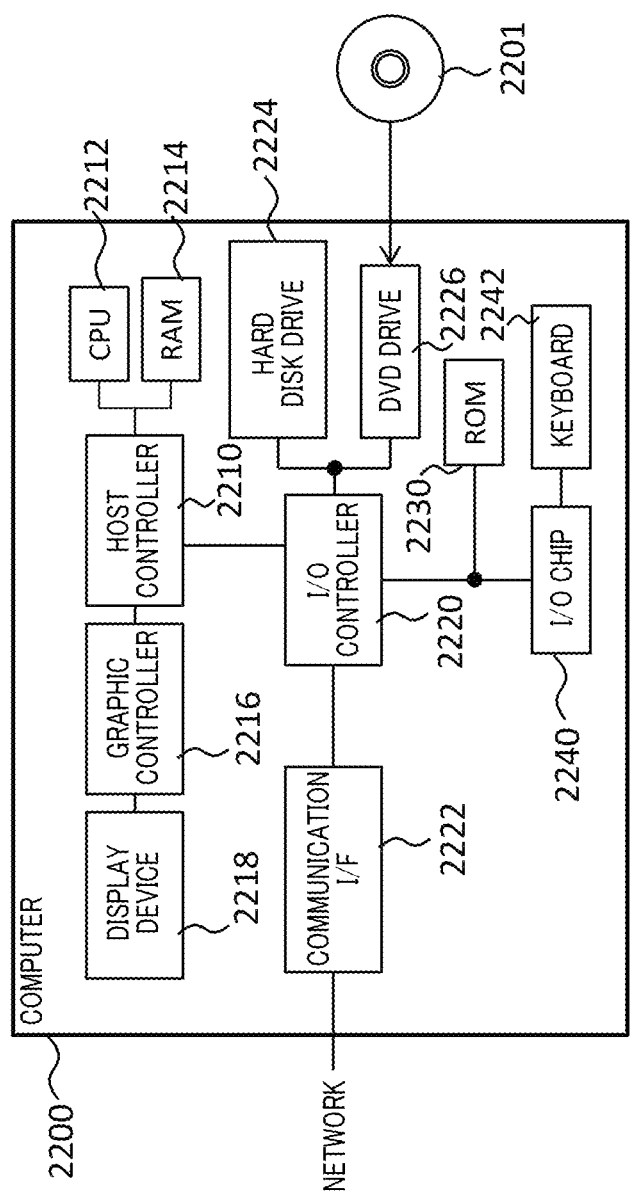
FIG. 4 illustrates an example of a computer 2200 in which a plurality of aspects of the present invention may be entirely or partially embodied.

FIG. 4 illustrates an example of a computer 2200 in which a plurality of aspects of the present invention may be entirely or partially embodied. A program that is installed in the computer 2200 can cause the computer 2200 to function as operations associated with apparatuses according to the embodiments of the present invention or one or more sections of the apparatuses thereof, or can cause the computer 2200 to perform the operations or the one or more sections thereof, and/or can cause the computer 2200 to perform processes of the embodiments according to the present invention or steps of the processes thereof. Such a program may be executed by the CPU 2212 to cause the computer 2200 to perform certain operations associated with some or all of the blocks of flowcharts and block diagrams described herein.

The computer 2200 according to the present embodiment includes a CPU 2212, a RAM 2214, a graphics controller 2216, and a display device 2218, which are interconnected by a host controller 2210. The computer 2200 also includes input/output units such as a communication interface 2222, a hard disk drive 2224, a DVD-ROM drive 2226, and an IC card drive, which are connected to the host controller 2210 via an input/output controller 2220. The computer 2200 also includes legacy input/output units such as a ROM 2230 and a keyboard 2242, which are connected to the input/output controller 2220 via an input/output chip 2240.

The CPU 2212 operates according to programs stored in the ROM 2230 and the RAM 2214, thereby controlling each unit. The graphics controller 2216 obtains image data generated by the CPU 2212 on a frame buffer or the like provided in the RAM 2214 or in itself, and causes the image data to be displayed on the display device 2218.

The communication interface 2222 communicates with other electronic devices via a network. The hard disk drive 2224 is configured to store programs and data used by the CPU 2212 within the computer 2200. The DVD-ROM drive 2226 is configured to read the programs or the data from a DVD-ROM 2201, and to provide the hard disk drive 2224 with the programs or the data via the RAM 2214. The IC card drive reads the program and data from an IC card, and/or writes the program and data to the IC card.

The ROM 2230 stores, in itself, a boot program or the like that is executed by the computer 2200 during activation, and/or a program that depends on hardware of the computer 2200. The input/output chip 2240 may also connect various input/output units to the input/output controller 2220 via a parallel port, a serial port, a keyboard port, a mouse port, and the like.

A program is provided by computer-readable media such as the DVD-ROM 2201 or the IC card. The program is read from the computer-readable medium, installed in the hard disk drive 2224, the RAM 2214, or the ROM 2230, which is also an example of the computer-readable medium, and executed by the CPU 2212. The information processing written in these programs is read into the computer 2200, resulting in cooperation between a program and the above-mentioned various types of hardware resources. An apparatus or method may be constituted by realizing the operation or processing of information in accordance with the usage of the computer 2200.

For example, when communication is performed between the computer 2200 and an external device, the CPU 2212 may execute a communication program loaded onto the RAM 2214 to instruct communication processing to the communication interface 2222, based on the processing described in the communication program. The communication interface 2222, under control of the CPU 2212, reads transmission data stored on a transmission buffering processing region provided in a recording medium such as the RAM 2214, the hard disk drive 2224, the DVD-ROM 2201, or the IC card, and transmits the read transmission data to a network or writes reception data received from a network to a reception buffering region or the like provided on the recording medium.

In addition, the CPU 2212 may cause all or a necessary portion of a file or a database to be read into the RAM 2214, the file or the database having been stored in an external recording medium such as the hard disk drive 2224, the DVD-ROM drive 2226 (the DVD-ROM 2201), the IC card, etc., and perform various types of processing on the data on the RAM 2214. The CPU 2212 then writes back the processed data to the external recording medium.

Various types of information, such as various types of programs, data, tables, and databases, may be stored in the recording medium to undergo information processing. The CPU 2212 may execute various types of processing on the data read from the RAM 2214 to write back a result to the RAM 2214, the processing being described throughout the present disclosure, specified by instruction sequences of the programs, and including various types of operations, information processing, condition determinations, conditional branching, unconditional branching, information retrievals/replacements, or the like. In addition, the CPU 2212 may search for information in a file, a database or the like, in the recording medium. For example, when a plurality of entries, each having an attribute value of a first attribute associated with an attribute value of a second attribute, are stored in the storage medium, the CPU 2212 may search for an entry matching the condition whose attribute value of the first attribute is designated, from the plurality of entries, and read the attribute value of the second attribute stored in the entry, thereby obtaining the attribute value of the second attribute associated with the first attribute satisfying a predetermined condition.

The above-described program or software modules may be stored in the computer-readable media on the computer 2200 or near the computer 2200. In addition, a storage medium such as a hard disk or a RAM provided in a server system connected to a dedicated communication network or the Internet can be used as the computer-readable medium, thereby providing the programs to the computer 2200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

1: switching apparatus; 11: first semiconductor switching device (IGBT); 12: second semiconductor switching device (MOSFET); 15: control unit; 100: substrate; 101: conductive layer; 102: bonding wire; 2200: computer; 2201: DVD-ROM; 2210: host controller; 2212: CPU; 2214: RAM; 2216: graphics controller; 2218: display device; 2220: input/output controller; 2222: communication interface; 2224: hard disk drive; 2226: DVD-ROM drive; 2230: ROM; 2240: input/output chip; 2242: keyboards

What is claimed is:

1. A switching apparatus, comprising:
a first semiconductor switching device of IGBT, and a second semiconductor switching device of a different type from IGBT, which are electrically connected in parallel; and
a control unit configured to turn on the second semiconductor switching device before the first semiconductor switching device,
wherein a maximum rated current of the second semiconductor switching device is greater than a maximum rated current of the first semiconductor switching device.

2. The switching apparatus according to claim 1, wherein the control unit is configured to make a time difference between the first semiconductor switching device being switched and the second semiconductor switching device being switched smaller in a case of turn-on than in a case of turn-off.

3. The switching apparatus according to claim 2, wherein the control unit is configured to set a switching timing of the first semiconductor switching device at the same time as or later than a switching timing of the second semiconductor switching device in the case of turn-on.

4. The switching apparatus according to claim 2, wherein the control unit is configured to set the time difference to a positive value during turn-off.

5. The switching apparatus according to claim 3, wherein the control unit is configured to set the time difference to a positive value during turn-off.

6. The switching apparatus according to claim 1, wherein the second semiconductor switching device is a MOSFET.

7. The switching apparatus according to claim 2, wherein the second semiconductor switching device is a MOSFET.

8. The switching apparatus according to claim 3, wherein the second semiconductor switching device is a MOSFET.

9. The switching apparatus according to claim 4, wherein the second semiconductor switching device is a MOSFET.

10. The switching apparatus according to claim 1, wherein the second semiconductor switching device is a wide bandgap semiconductor device.

11. The switching apparatus according to claim 2, wherein the second semiconductor switching device is a wide bandgap semiconductor device.

12. The switching apparatus according to claim 3, wherein the second semiconductor switching device is a wide bandgap semiconductor device.

13. The switching apparatus according to claim 4, wherein the second semiconductor switching device is a wide bandgap semiconductor device.

14. The switching apparatus according to claim 6, wherein the second semiconductor switching device is a wide bandgap semiconductor device.

15. A switching method, comprising:
controlling to turn on a second semiconductor switching device before a first semiconductor switching device among the first semiconductor switching device of IGBT and the second semiconductor switching device of a different type from IGBT, which are connected electrically in parallel,
wherein a maximum rated current of the second semiconductor switching device is greater than the maximum rated current of the first semiconductor switching device.

* * * * *